(12) United States Patent
Monoe et al.

(10) Patent No.: US 7,560,315 B2
(45) Date of Patent: *Jul. 14, 2009

(54) MANUFACTURING METHOD FOR SEMICONDUCTOR DEVICE

(75) Inventors: Shigeharu Monoe, Kanagawa (JP); Takashi Yokoshima, Kanagawa (JP); Shinya Sasagawa, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 359 days.

This patent is subject to a terminal disclaimer.

(21) Appl. No.: 11/438,303

(22) Filed: May 23, 2006

(65) Prior Publication Data
US 2007/0015370 A1   Jan. 18, 2007

Related U.S. Application Data

(62) Division of application No. 10/777,117, filed on Feb. 13, 2004, now Pat. No. 7,172,931.

(30) Foreign Application Priority Data
Feb. 17, 2003   (JP) .............................. 2003-038888

(51) Int. Cl.
  *H01L 21/00* (2006.01)
  *H01L 21/461* (2006.01)
(52) U.S. Cl. .................. 438/149; 438/720; 438/738; 438/739
(58) Field of Classification Search .................. 438/149, 438/163, 164, 673, 720, 738, 739
See application file for complete search history.

(56) References Cited

U.S. PATENT DOCUMENTS 4,707,721 A   11/1987   Ang et al.

(Continued)

FOREIGN PATENT DOCUMENTS

EP   1 128 430 A2   8/2001

(Continued)

OTHER PUBLICATIONS

Ohgata, K. et al., "A New Dopant Activation Technique for Poly-Si TFTs with a Self-Aligned Gate-Overlapped LDD Structure", *IEDM: Technical Digest of International Electron Devices Meeting*, (Dec. 10, 2000), pp. 205-208, San Francisco, USA.

(Continued)

*Primary Examiner*—Michael Trinh
(74) *Attorney, Agent, or Firm*—Nixon Peabody LLP; Jeffrey L. Costellia

(57) ABSTRACT

It is an object of the present invention to enhance a selection ratio in an etching process, and provide a method for manufacturing a semiconductor device that has favorable uniform characteristics with high yield. In a method for manufacturing a semiconductor device according to the present invention, a first layer is formed over a substrate, second layer is formed on the first layer, the first layer and the second layer are etched to form a first pattern, and the second layer in the first pattern is selectively etched with plasma of boron trichloride, chlorine, and oxygen using ECR (Electron Cyclotron Resonance) or ICP (Inductively Coupled Plasma) to form a second pattern.

6 Claims, 12 Drawing Sheets

U.S. PATENT DOCUMENTS

| | | | |
|---|---|---|---|
| 4,963,504 A | 10/1990 | Huang | |
| 5,177,577 A | 1/1993 | Taniguchi et al. | |
| 5,445,710 A | 8/1995 | Hori et al. | |
| 5,498,573 A | 3/1996 | Whetten | |
| 5,583,067 A | 12/1996 | Sanchez | |
| 6,201,281 B1 | 3/2001 | Miyazaki et al. | |
| 6,235,558 B1 | 5/2001 | Oda et al. | |
| 6,514,872 B1 * | 2/2003 | Oikawa | 438/725 |
| 6,596,571 B2 | 7/2003 | Arao et al. | |
| 6,646,287 B1 | 11/2003 | Ono et al. | |
| 6,706,544 B2 | 3/2004 | Yamazaki et al. | |
| 6,872,604 B2 | 3/2005 | Yamazaki et al. | |
| 6,933,184 B2 | 8/2005 | Arao et al. | |
| 7,172,931 B2 * | 2/2007 | Monoe et al. | 438/163 |
| 2001/0030322 A1 | 10/2001 | Yamazaki et al. | |
| 2001/0035526 A1 | 11/2001 | Yamazaki et al. | |
| 2001/0041392 A1 | 11/2001 | Suzawa et al. | |
| 2001/0048408 A1 | 12/2001 | Koyama et al. | |
| 2001/0052950 A1 | 12/2001 | Yamazaki et al. | |
| 2001/0055841 A1 | 12/2001 | Yamazaki et al. | |
| 2002/0000551 A1 | 1/2002 | Yamazaki et al. | |
| 2002/0048829 A1 | 4/2002 | Yamazaki et al. | |
| 2002/0102776 A1 | 8/2002 | Yamazaki et al. | |
| 2002/0163049 A1 | 11/2002 | Yamazaki et al. | |
| 2003/0020118 A1 | 1/2003 | Kajiwara et al. | |
| 2003/0062524 A1 | 4/2003 | Kimura | |
| 2003/0100151 A1 | 5/2003 | Okamoto | |
| 2004/0023478 A1 | 2/2004 | Samavedam et al. | |
| 2004/0087125 A1 | 5/2004 | Monoe | |
| 2004/0140472 A1 | 7/2004 | Fujimoto et al. | |
| 2004/0209409 A1 | 10/2004 | Monoe et al. | |
| 2005/0181610 A1 | 8/2005 | Sasagawa et al. | |

FOREIGN PATENT DOCUMENTS

| | | |
|---|---|---|
| JP | 06-053324 | 2/1994 |
| JP | 10-012605 | 1/1998 |
| JP | 2000-269331 | 9/2000 |
| JP | 2000-294787 | 10/2000 |
| JP | 2001-313397 | 11/2001 |
| JP | 2002-014337 | 1/2002 |
| JP | 2003-257950 | 9/2003 |

OTHER PUBLICATIONS

Mishima, Y. et al., Improved Lifetime of Poly-Si TFTS with a Self-Aligned Gate-Overlapped LDD Structure:, *IEEE Transactions on Electron Devices*, (Jun. 2002), vol. 49, No. 6, pp. 981-985.

U.S. Appl. No. 10/731,000, filed Dec. 10, 2003.

U.S. Appl. No. 10/731,089, filed Dec. 10, 2003.

M. Wittmer et al., "Characteristics of TIN gate metal-oxide-semiconductor field effect transistors", J. Appl. Phys. vol. 54, No. 3, Mar. 1983, pp. 1423-1428.

* cited by examiner

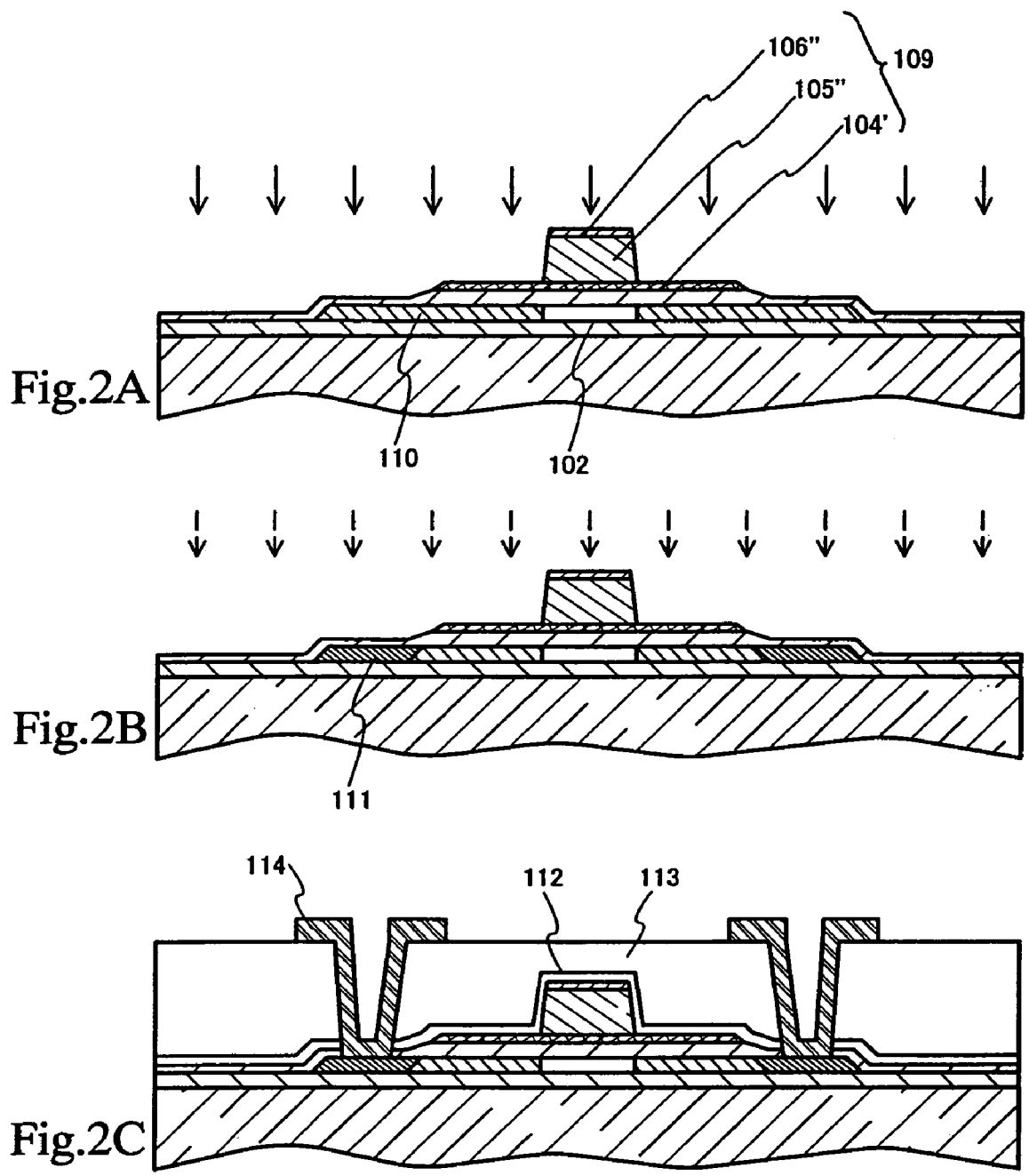

MANUFACTURING METHOD FOR SEMICONDUCTOR DEVICE

BACKGROUND OF THE INVENTION

1. Field of the Invention

The present invention relates to a method of manufacturing a semiconductor device. In particular, the present invention relates to a technique of processing a gate electrode of the semiconductor device with etching to form an impurity region in a semiconductor layer.

2. Description of the Related Art

In a display device using liquid crystal, a part with a large-screen over 20 inches, which is typified by a liquid crystal display TV, has been put to practical use. In recent years, a liquid crystal display device integrated with a driving-circuit has been realized with a TFT in which a polycrystalline silicon film is used as an active layer.

However, a defect is pointed out that a thin film transistor (TFT) using a polycrystalline silicon film has a low withstanding pressure in drain junction to increase junction leak current (hereinafter, OFF-leak current). It is known that it is effective to form a lightly doped region (LDD) structure as measures.

The phenomenon is pointed out as trouble that high electric field is generated in the vicinity of the drain region, then, a generated hot carrier is trapped by a gate insulating film on the LDD region, and then, device characteristics such as threshold voltage are greatly fluctuated and lowered. In order to prevent the deterioration due to hot carriers, a TFT in which a gate electrode is overlapped with an LDD (lightly doped drain) region is disclosed (for example, referred to as Japanese Patent Laid-Open No. 2000-294787). The TFT with the gate overlapped LDD structure has higher current driving ability compared to a TFT with a normal LDD structure, and effectively eases the high electric field in the vicinity of the drain region to suppress the deterioration due to hot carriers.

However, in the case of the TFT with the gate overlapped LDD structure disclosed in the above publication, after an impurity region for forming an LDD region is formed in a semiconductor layer, a gate electrode is overlapped with the LDD region. Accordingly, the portion overlapping with the gate electrode cannot be accurately formed along with the miniaturization of design rule.

On the other hand, as a method for manufacturing a TFT with a gate overlapping LDD structure in a self-aligning manner, the technique is disclosed that a conductive layer that has at least two layer laminated is subjected to exposure once and etching plural times to make the upper layer and the lower layer have different sizes, and then, ion doping is conducted with utilizing the differences in size and thickness to form an LDD region overlapped with a gate electrode in a self-aligning (for example, referred to as Japanese Patent Laid-Open No. 2002-14337).

It is preferable that a length of the LDD. (a length with respect to the channel length) is optimized depending on driving voltage of the TFT in order to maximally show the function of the LDD overlapped with the gate electrode as measures against the deterioration in TFT characteristics due to hot carriers. Consequently, it is necessary to adjust the length of the LDD (a length with respect to the channel length) to an optimum length for easing effectively the high electric field in the vicinity of the drain region.

The length of the LDD overlapped with the gate electrode is controlled in accordance with a shape of a conductive layer that becomes a mask during ion doping for the LDD. A conductive layer of two-layer lamination is subjected to an etching process and only the upper layer of the conductive layer is selectively subjected to an anisotropic etching process to form the mask Consequently, it is important that a selection ratio of a material that forms the conductive layer is high in the anisotropic etching process.

In short, it is necessary to consider the relation between etching gas and the material that is an object to be processed. If the selection ratio is low, a portion that needs no etching is etched to have problems that a desired shape cannot be obtained and each shape is not uniform. In addition, conditions in the process of the etching process cannot be controlled precisely. Consequently, reliability of a semiconductor device is lowered and yield is also decreased.

SUMMARY OF THE INVENTION

It is an object of the present invention to enhance a selection ratio in an etching process, prevent degradation of characteristics in- semiconductor device due to hot carriers and the like, and provide a method for manufacturing a semiconductor device that has favorable uniform characteristics with high yield.

In a method for manufacturing a semiconductor device according to the present invention, a semiconductor layer is formed, a gate insulating film is formed on the semiconductor film, a first conductive layer is formed on the gate insulating film, a second conductive layer is formed on the first conductive layer, the first conductive layer and the second conductive layer are etched to form a first conductive-layer pattern, the second conductive layer in the first conductive-layer pattern is selectively etched with plasma of boron trichloride, chlorine, and oxygen to form a second conductive-layer pattern, and a first impurity region and a second impurity region are formed in the semiconductor layer.

In another method for manufacturing a semiconductor device according to the present invention, a semiconductor layer is formed, a gate insulating film is formed on the semiconductor film, a first conductive layer is formed on the gate insulating film, a second conductive layer is formed on the first conductive layer, a third conductive layer is formed in the second conductive layer, the first conductive layer, the second conductive layer, and the third conductive layer are etched to form a first conductive-layer pattern, the second conductive layer and the third conductive layer in the first conductive-layer pattern are selectively etched with plasma of boron trichloride, chlorine and oxygen to form a second conductive-layer pattern, and a first impurity region and a second impurity region are formed in the semiconductor layer.

In the method above, in etching selectively the second conductive layer in the first conductive-layer pattern or etching selectively the second -conductive layer and the third conductive layer in the first conductive-layer pattern, it is possible to etch the second conductive layer and the third conductive layer with favorable selectivity to the first conductive layer when the plasma of boron trichloride, chlorine, and oxygen is used. The high election ratio makes it possible to obtain the second conductive-layer pattern in a desired shape, precisely control a range of the impurity region that has an effect of preventing degradation due to hot carrier, and manufacture a semiconductor device that has favorable uniform characteristics and high reliability with high yield.

In the method above, it is possible to form the second conductive-layer pattern in which a width of the first conductive layer is different from that of the second conductive layer in the direction of a channel length when the second conductive layer in the first conductive-layer pattern is selectively etched. When the second conductive-layer pattern is used as a mask for shielding ions accelerated by an electric field, the first impurity region and the second impurity region can be formed in the semiconductor layer. Further, the second impurity region is formed in a region that is overlapped with the first conductive layer and the first impurity region is formed in a region that is not overlapped with the first conductive layer.

When the, second conductive-layer pattern is formed in order for an edge of the second or third conductive layer in the second conductive-layer pattern to be positioned inside an edge of the first conductive-layer pattern, the second impurity region that is overlapped with the first conductive layer can be made a lightly doped impurity region that has a lower concentration than the first impurity region. In other words, a lightly doped drain region can be formed in self-aligning. The LDD region overlapped with the gate electrode makes it possible to prevent degradation of characteristics in semiconductor device due to hot carriers and the like to increase a lifetime. Of course, the second conductive-layer pattern can be used as a gate electrode.

In addition, it becomes possible to dope a semiconductor layer with an impurity element to form an impurity region in self-aligning, and therefore, the number of masks can be reduced more than conventionally and trouble in forming a mask can also be eliminated. Accordingly, it is also possible to reduce the production cost of a semiconductor device and time necessary for the production.

Besides, in the specification for the sake of convenience, an angle made by a side slant of a conductive layer and the horizontal plane is-referred to as a taper angle, the side slant that has the taper angle is referred to as a tapered shape, and a portion that has the tapered shape is referred to as a tapered portion.

In the method above, it is desired that the first conductive-layer pattern be formed to have an edge in a tapered shape. Being in the tapered shape makes it possible to prevent a reaction by-product from adhering to an object to be processed in etching. Accordingly, a favorable shape can be obtained.

In the method above, an appropriate combination of the first and second conductive layers is the first conductive layer comprising tantalum nitride and the second conductive layer comprising titanium or one of an alloy and a compound containing titanium as its main component. When the materials are used, it is effective that etching can be performed with a higher selection ratio in etching with plasma of boron trichloride, chlorine, and oxygen. In addition, titanium is more costless than expensive tungsten, which is widely used.

In the specification, etching for forming a first conductive-layer pattern is named a taper etching process, and etching for forming a second conductive-layer pattern is named an anisotropic etching process. In addition, a length of an impurity region (LDD) overlapped with a gate electrode is named "Lov" in the direction of a channel length.

BRIEF DESCRIPTION OF THE DRAWINGS

In the accompanying drawings:

FIGS. 2A to 2C are sectional views for explaining a process for manufacturing the semiconductor device according to the present invention;

DETAILED DESCRIPTION OF THE INVENTION

Embodiment Mode

Hereinafter, an embodiment mode of the present invention will be described in detail with reference to the drawings. It should be understood that the invention is not limited to the following embodiment mode and that various modifications are permitted without departing from, the spirit and scope thereof.

The applicant has considered the length (Lov) of an LDD overlapped with a gate electrode, which is necessary for controlling degradation due to hot carriers as follows.

Figure 9:
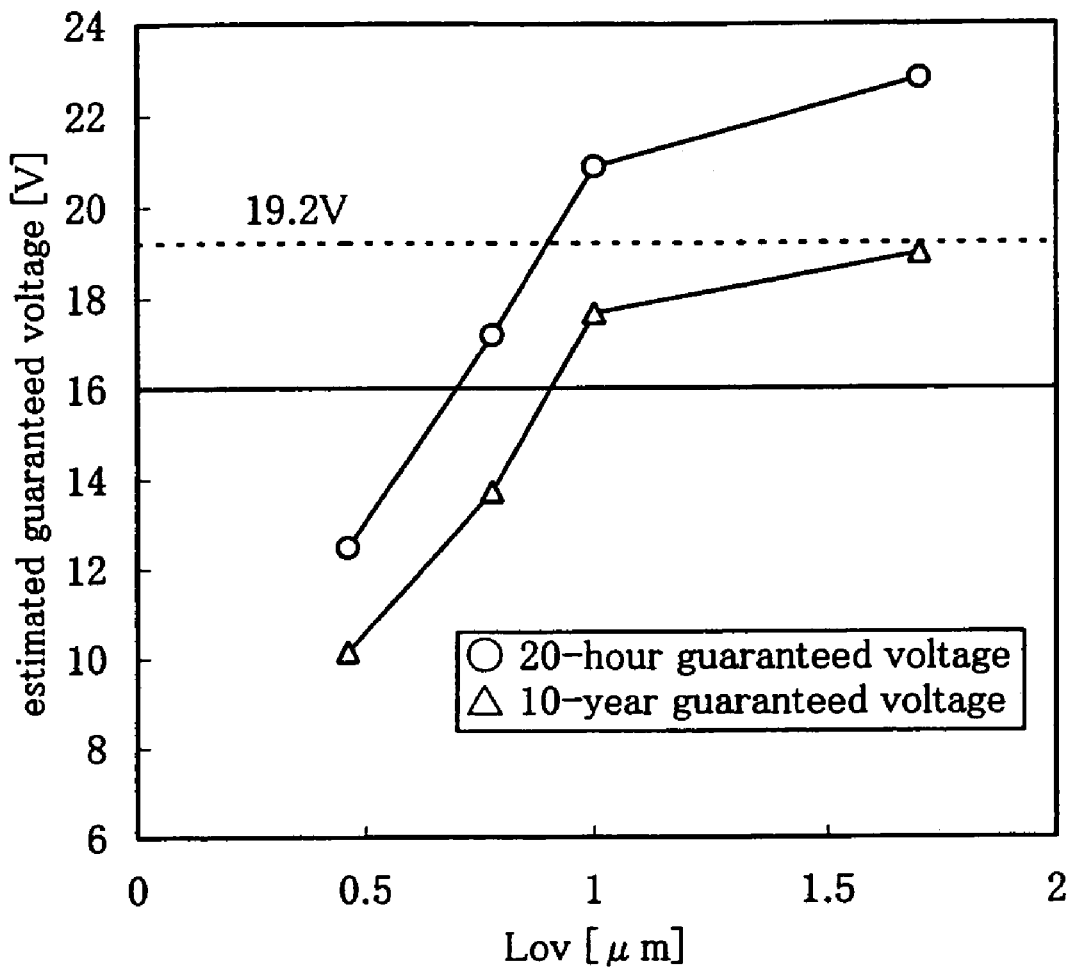
FIG. 9 is a graph showing the dependency of an estimated guaranteed voltage (10% deterioration of ON-state current) on a length of a Lov.
Figure 10:
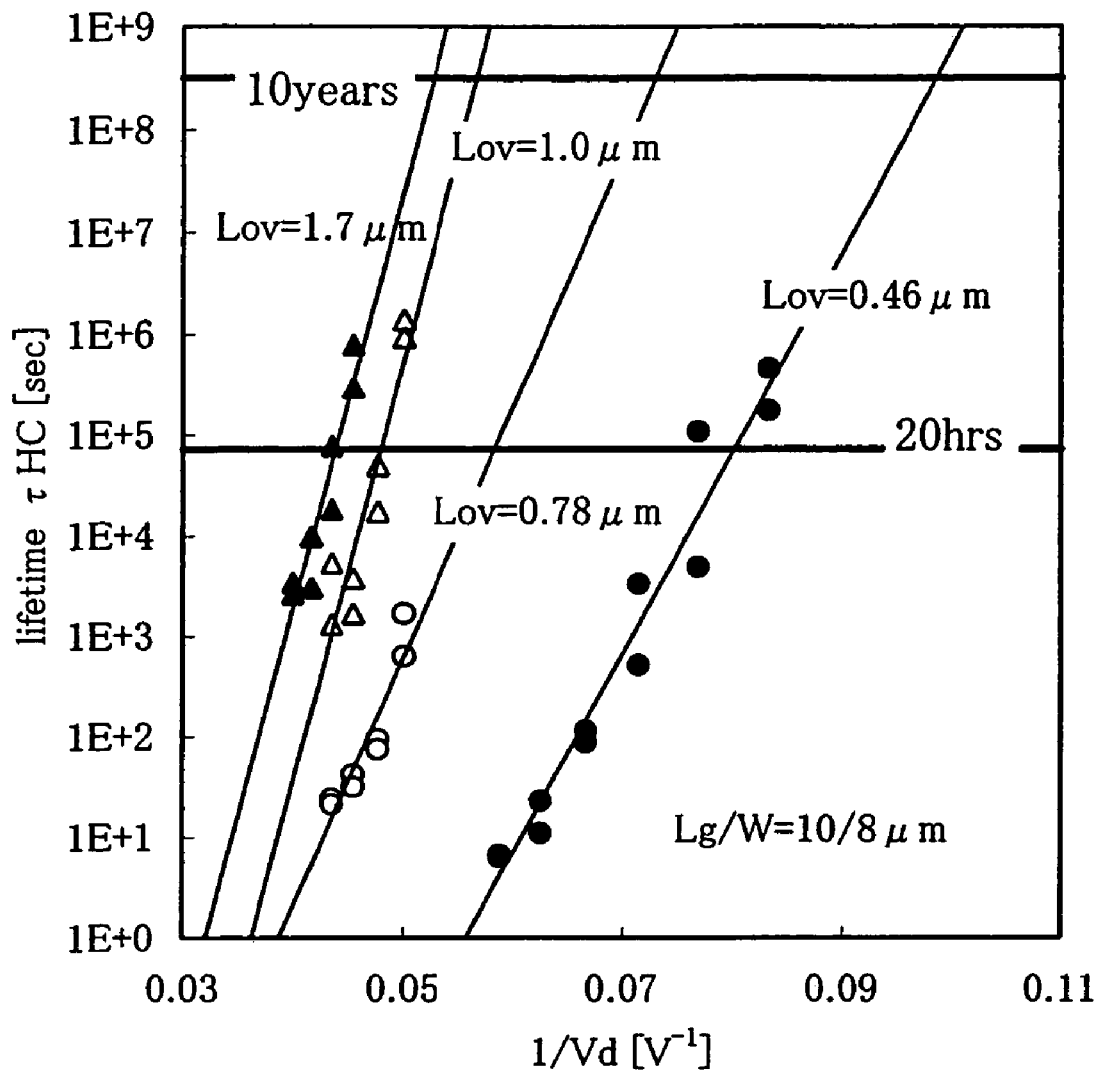
FIG. 10 is a characteristic diagram for estimating a lifetime of a TFT in accordance with a bias stress test and a graph showing the dependency on Lov.

First, the time until decrease of the maximum field-effect mobility by 10% is defined as lifetime in the case where the Lov is a predetermined value to degradation of a TFT, and the voltage at which the lifetime becomes ten years is derived as ten-year guaranteed voltage from a linear relationship obtained by plotting the reciprocal of a drain voltage on a semilogarithmic graph, as shown in FIG. 10. For example, in FIG. 10, the ten-year guaranteed voltage of a TFT with a Lov of 1.0 μm is about 18 V. It is noted that a high-voltage power source often has 16V in a liquid crystal panel and it is-required to obtain guaranteed voltage of 19.2 V or more, which has a margin of twenty percent. FIG. 9 is a graph in which thus obtained value of the estimated guaranteed voltage is plotted in the case where Lov has each of 0.5 μm, 0.78 μm, 1.0 μm, and 1.7 μm. FIG. 9 also shows a value of drain voltage as twenty-hour guaranteed voltage, at which the time until change in ON-state current of the TFT by 10% is 20 hours in a bias stress test.

Although degradation due to hot carrier effect is insignificant with low driving voltage, it becomes difficult to be negligible in the case of driving at 10 V or more. FIG. 9 clearly shows that it is necessary to make the Lov 1 μm or more, preferably, 1.5 μm or more in the case of the driving voltage of 16 V.

Consequently, in the present embodiment mode, a semiconductor device with Lov from 1 to 1.5 μm, which is a length necessary for driving a TFT with a channel length on the order of 10 μm at 10 to 20 V, is manufactured. However, the length may be appropriately set depending on a channel length and a driving voltage, and is not limited to the present embodiment mode. When a method for manufacturing a semiconductor device, according to the present invention, is employed, it is possible to control a length of Lov precisely and manufacture a semiconductor device that has favorable characteristics and high reliability with high yield.

Figure 1A:
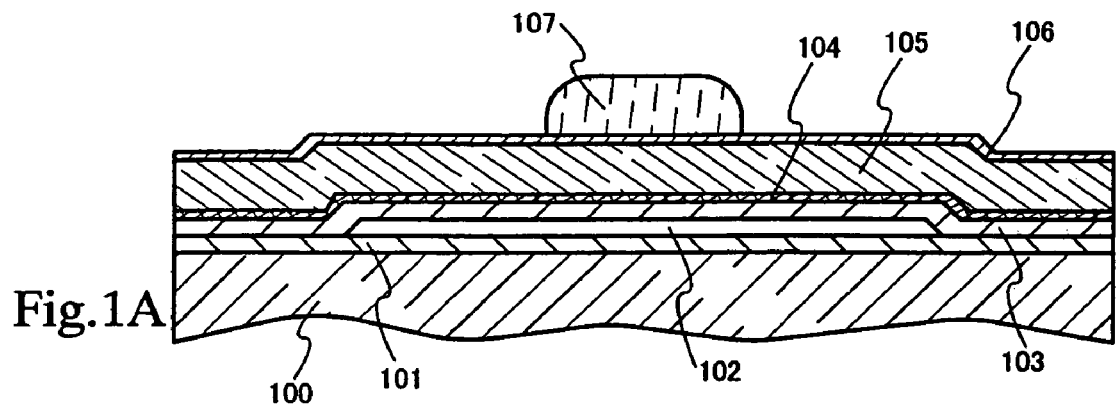
FIGS. 1A to 1D are sectional views for explaining a process for manufacturing a semiconductor device according to the present invention.

In FIG. 1A, a first insulating film (base film) 101, a semiconductor layer 102, and a second insulating film (gate insulating film) 103 are formed on a glass substrate 100, and a first conductive layer 104, a second conductive layer 105, a third conductive film 106 are formed thereon. A mask pattern 107 is formed with the use of a photoresist according to photolithographic processing.

As the first conductive layer, high melting metal such as tungsten (W), chromium (Cr), tantalum (Ta), tantalum nitride (TaN), or molybdenum (Mo) is formed to have a thickness from 30 to 50 nm, and the second conductive layer is formed of titanium or one of an alloy or a compound containing titanium as its main component to have a thickness from 300 to 600 nm.

For the third conductive layer, metal such as titanium nitride TiN) or tungsten (W) is used. The third conductive layer is provided as a stopper film in forming a contact hole in an interlayer film formed on the third conductive layer, and is not the essential component required in the present invention. It makes selective processing possible to combine the first conductive layer of tantalum nitride since titanium nitride can be processed with the same etching gas as that for titanium.

Figure 1B:
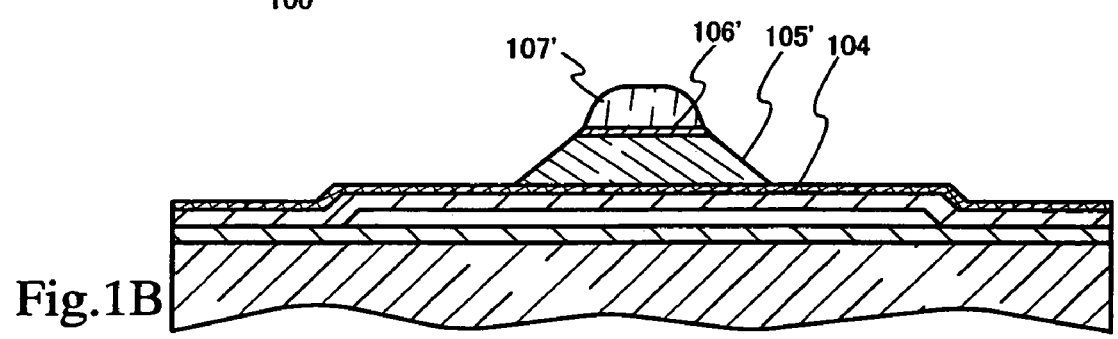

Next, as shown in FIG. 1B, etching is performed to the second conductive layer 105 and the third conductive layer 106 with dry etching. As etching gas, a combination of gases selected from fluorine-based gas such as $CF_4$ or $SF_6$, chlorine-based gas such as $Cl_2$ or $BCl_3$, and $O_2$ is used. To increase an etching rate, a dry etching system that uses a high-density plasma source such as ECR (Electron Cyclotron Resonance) or ICP (Inductively Coupled Plasma) is used.

Figure 1C:
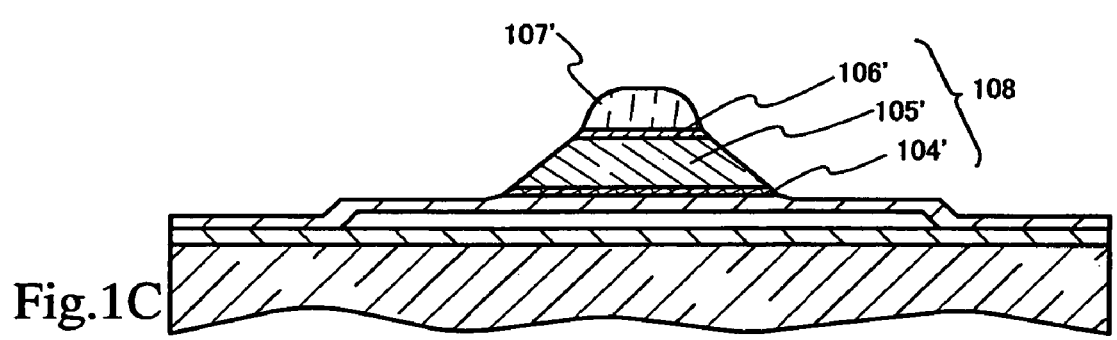

Next, as shown in FIG. 1C, the etching gas is changed to $CF_4$ and $Cl_2$ to etch tantalum nitride that is the first conductive layer 104. The performance of two steps of etching processes in this way has an advantage of preventing a base from being etched to be extremely thin in the case where the base is silicon oxide.

Of course, all of the conductive layers may be etched at the same time to the state in FIG. 1C. In this case, it is necessary to set longer etching time in consideration of fluctuation in etching rate in etching the second conductive layers 105 with the thick film thickness. With dry etching, all of the first conductive layer 104, the second conductive layer 105, and the third conductive layer 106 are subjected to etching at once. As etching gas, gas such as $CF_4$, $SF_6$, $Cl_2$, $BCl_3$, or $O_2$ is used. To increase an etching rate, a dry etching system that uses a high-density plasma source such as ECR (Electron Cyclotron Resonance) or ICP (Inductively Coupled Plasma) is used. In order to process an edge or a sidewall in a tapered shape in accordance with the mask pattern, a negative bias voltage is applied to the substrate side.

Figure 7A:
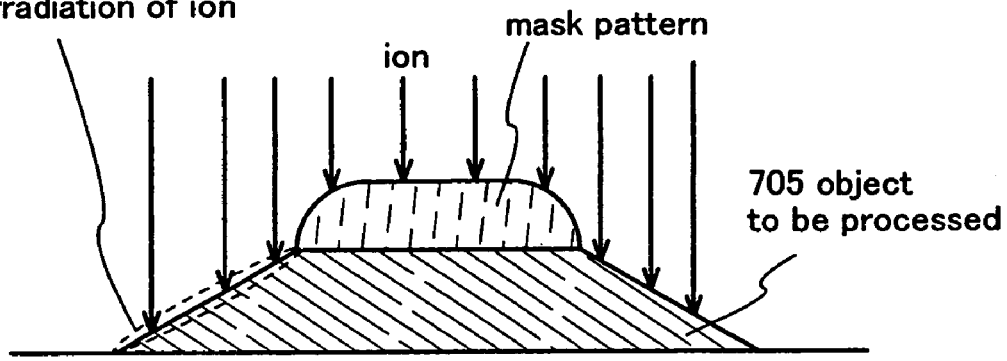
FIGS. 7A and 7B are diagrams for explaining an effect of removing a reaction by-product by taper etching.
Figure 7B:
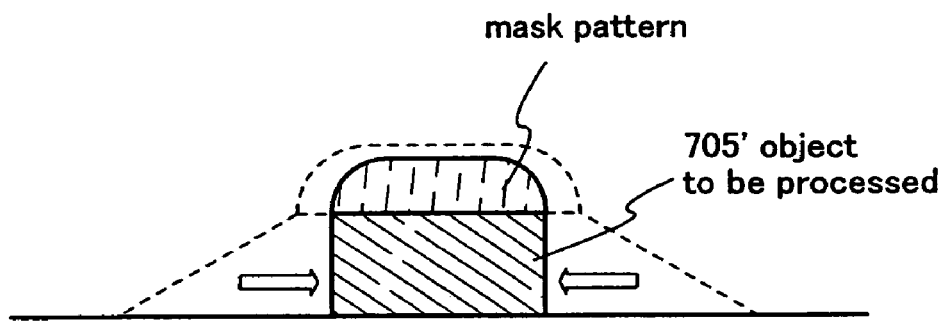
Figure 8A:
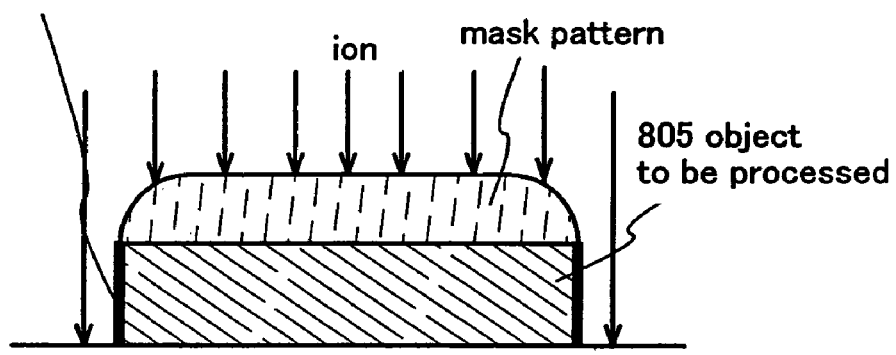
FIGS. 8A and 8B are diagrams for explaining an effect of a reaction by-product in the case where the taper etching is not performed.
Figure 8B:
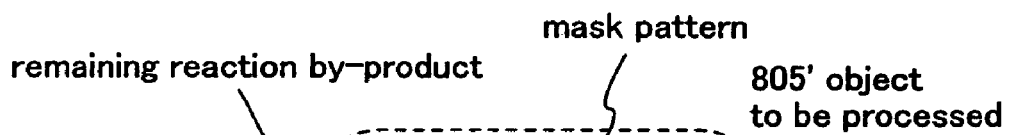

The mask pattern formed of resist is sputtered by ions accelerated by an electric field, and a reaction by-product adheres to a sidewall of an object to be processed. This is also called a sidewall protective film, and the reason why the object to be processed is tapered in the process at this stage is to remove the sidewall protective film. Namely, since a reaction by-product is hardly deposited on a sidewall when anisotropic etching is thereafter performed to an object to be processed 705 with a tapered portion as shown in FIG. 7A, it is possible to perform an etching process without leaving residue to form a pattern 705' as shown in FIG. 7B. On the other hand, when a sidewall of an object to be processed 805 is substantially vertical as shown in FIG. 8A, a reaction by-product is deposited during an etching process, and the reaction by-product remains to cause malformation when an anisotropic etching is performed thereafter, as shown in FIG. 8B. In other words, when an object to be processed is tapered, the sidewall protective film can be removed. Consequently, in the present embodiment mode, the conductive layers that are objects to be processed are tapered in the process at this stage.

In this way, a first conductive-layer pattern 108 comprising a first conductive layer 104', a second conductive layer 105', and a second conductive layer 106' is formed on the second insulating film 103, as shown in FIG. 1C. The angle made by the tapered shape at the edge and a surface of the substrate 100 is made from 10 to 30 degrees. Although the angle is determined depending mainly on the relations with the film thickness of the second conductive layer, the length occupied by the tapered portion is made about from 0.5 to 15 μm.

After the respective conductive layers are subjected to the taper etching process, argon plasma treatment may be conducted to remove a reaction product adhering to the taper sidewall. When the argon plasma treatment is conducted, a portion that is not etched can be prevented from being left at the edge of the second conductive layer, a nearly perpendicular shape is easily formed in an isotropic etching later.

Figure 1D:
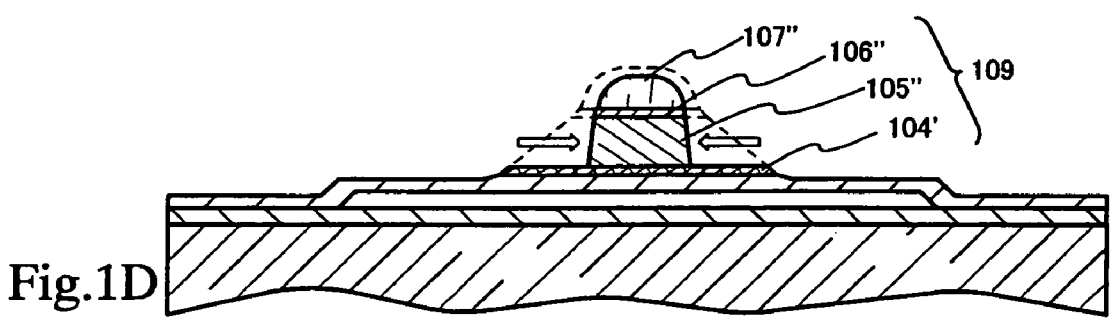

Then, with the use of $BCl_3$, $Cl_2$, and $O_2$ as etching gas, the second conductive layer 105' and the third conductive layer 106' are selectively etched in accordance with a mask pattern 107'. In this case, the bias voltage to be applied to the substrate side is lowered to thereby leave the first conductive layer 104'. The edge of the second conductive layer 105' is recessed inward from the first conductive layer 104', and the length of Lov is determined depending on the recess amount, as will be described later. In this manner, a second conductive-layer pattern 109 comprising the first conductive layer 104', a second conductive layer 105'', and a third conductive layer 106'' are formed, which becomes a gate electrode at a portion intersecting with the semiconductor layer 102 (FIG. 1D).

For the etching process in forming the second conductive-layer pattern, the use of etching gas comprising $BCl_3$, $Cl_2$, and $O_2$ allows the selection ratio of the second conductive layer 105'' and the third conductive layer 106'' to the first conductive layer 104' to be larger. The good selectivity makes it possible to control the length of Lov without etching the first conductive layer 104'. Accordingly, it is possible to prevent degradation of characteristics in semiconductor device due to hot carriers and manufacture a semiconductor device that has favorable uniform characteristics with high yield.

The addition of an impurity with one conductivity type to the semiconductor film 102, that is, the formation of an LDD and a source/drain region can be performed in self-aligning with the use of the second conductive-layer pattern 109. FIG. 2A shows a doping process for forming an LDD that overlaps with the gate electrode, wherein an ion of the impurity with the one conductivity type is made to pass through the first conductive layer 104' and added to the semiconductor layer 102 positioned below to form an one conductivity type impurity region 110 with a first concentration. In this case, an acceleration voltage of 50 kV or more is required depending on the film thicknesses of the second insulating film and the first conductive layer. The concentration of the impurity in the impurity region of the one conductivity type impurity region 110 with the first concentration is set from $1\times10^{16}$ to $5\times10^{18}/cm^3$ (peak value) in the case of the LDD.

In the doping process for forming the source/drain region, the second conductive-layer pattern 109 is used as a mask for shielding ions and an one conductivity type impurity region 111 with a second concentration is formed outside the one conductivity type impurity region 110 with the first concentration. In this case, the acceleration voltage is set at 30 kV or less. The concentration of the impurity in the one conductivity type impurity region 111 with the second concentration is set at $1\times10^{19}$ to $5\times10^{21} cm^3$ (peak value).

After that, a third insulating film 112 comprising silicon nitride, a fourth insulating film 113 comprising a low-dielectric organic compound material, and a wiring 114 are formed.

As described above, according to the present embodiment mode, it is possible to form an LDD overlapping with a gate electrode in self-aligning and to control the LDD (Lov) for a necessary length with the use of the gate electrode as a mask during ion doping. In addition, according to the present invention, the length of an LDD region overlapping with a gate electrode can be controlled precisely to enable increasing a lifetime against degradation due to hot carriers and manufacturing a semiconductor device that has high reliability with high yield.

EMBODIMENTS

Embodiment 1

In the present embodiment, an example of forming a gate electrode according to a process based on the embodiment mode will be described. The present embodiment will be described with reference to FIG. 1A to FIG. 2C.

In the present embodiment mode, a semiconductor device with Lov from 1 to 1.5 μm, which is a length necessary for driving a TFT with a channel length on the order of 10 μm at 10 to 20 V, is manufactured. However, the length may be appropriately set depending on a channel length and a driving voltage, and is not limited to the present embodiment. When a method for manufacturing a semiconductor device, according to the present invention, is employed, it is possible to control a length of Lov precisely and manufacture a semiconductor device that has favorable characteristics and high reliability with high yield.

First, the first insulating layer 101 is formed of a silicon oxynitride film of 150 nm in thickness on the aluminosilicate-glass substrate 100 with plasma CVD. The semiconductor layer 102 is formed of a crystalline silicon film for which an amorphous silicon film of 50 nm in thickness is crystallized by laser annealing so as to be isolated and separated into the shape of an island. As the second insulating film 103, a silicon oxynitride film of 115 nm in thickness is formed by plasma CVD with the use of $SiH_4$ and $N_2O$ as source gas. The first conductive layer 104 formed of tantalum nitride (TaN) is made 30 nm in thickness, the second conductive layer 105 formed of titanium is made 320 nm in thickness, and the third conductive layer 106 formed of titanium nitride is formed to have a thickness of 50 nm. The mask pattern 107 is formed of a positive photoresist to have a thickness of 1.5 μm. Although the width of the mask pattern 106 may be set appropriately, photolithographic processing is performed with mask patterns with 4.5 μm and 10 μm in the present embodiment (FIG. 1A).

Figure 3:
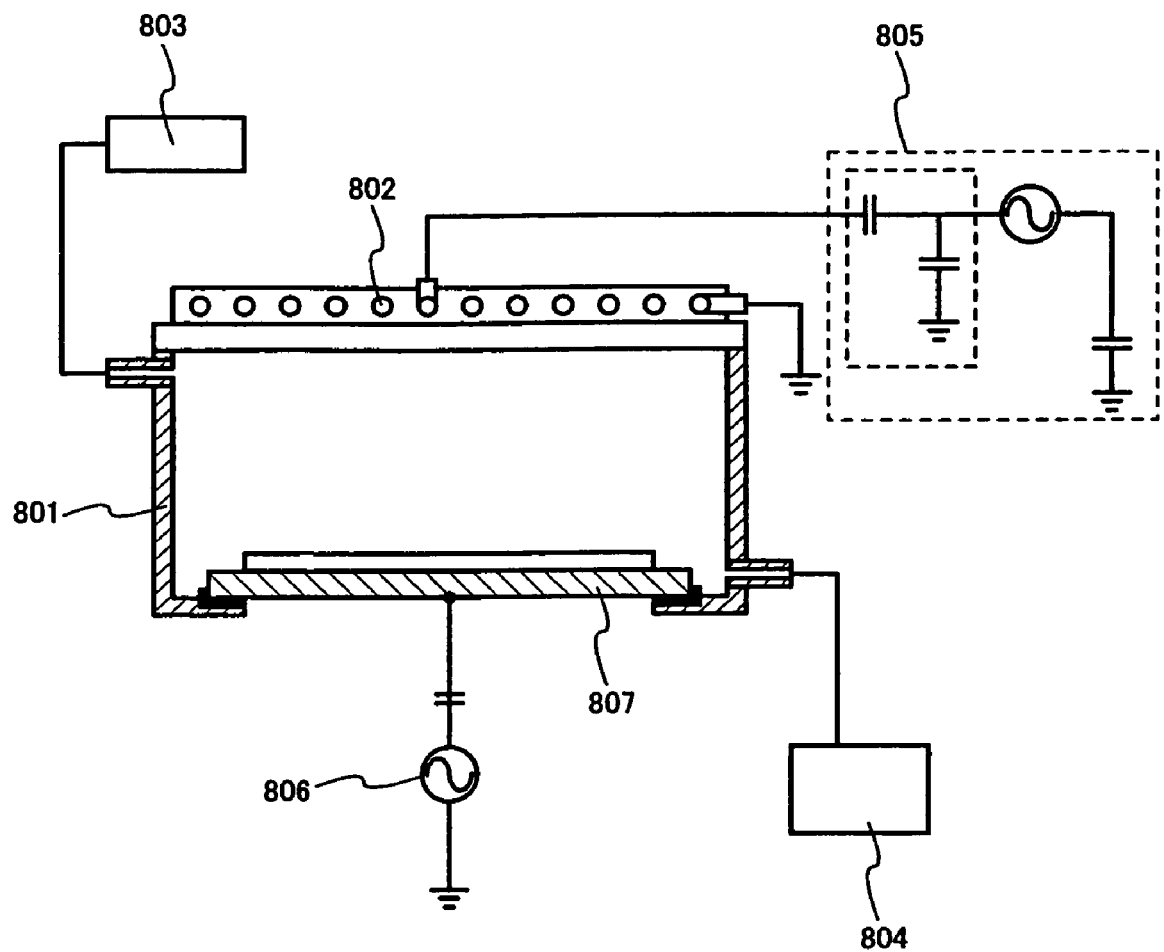
FIG. 3 is a diagram for explaining a configuration of an ICP etching device.

Next, etching is performed to the second conductive layer (titanium) 105 and the third conductive layer (titanium nitride) 106 by dry etching. For etching, an ICP etching system is used. FIG. 3 shows the configuration of the ICP etching system. A reaction chamber 801 is connected to a gas supply means 803 for etching and an exhaust means 804 for maintaining reduced pressure in the reaction chamber 801. A plasma generation means has a spiral coil 802 for inductively coupling to the reaction chamber 801 through a quartz plate and a high-frequency. (13.56 MHz) power supply means 805. The application of bias voltage to the substrate side is conducted by a high-frequency (13.56 MHz) power supply means 806 to generate self-bias to a stage with the substrate thereon. For the etching process, the kind of etching gas to be supplied, high-frequency power supplied from each of the high-frequency (13.56 MHz) power supply means 805 and 806, and etching pressure are main parameters.

For the etching process in FIG. 1B, gas such as $CF_4$, $SF_6$, $Cl_2$, $BCl_2$, and $O_2$ is used as etching gas. The etching pressure is set at 1.3 Pa, and each of 500 W of power for generating plasma and 300 W of power for biasing the substrate is supplied. Subsequently, as shown in FIG. 1C, the etching gas is changed to $CF_4$ and $Cl_2$ to etch tantalum nitride that is the first conductive layer. As the etching condition in this case, each of 1.5 Pa of etching pressure and 500 W of power for generating plasma and 10 W of power for biasing the substrate is supplied. In this way, the first conductive-layer pattern 108 can be formed.

The first conductive-layer pattern 108 may be formed with etching once. In this case, gas such as $CF_4$, $SF_6$, $Cl_2$, $BCl_2$, and $O_2$ is used as etching gas for the etching process. The etching pressure is set at 1.3 Pa, and each of 800 W of power for generating plasma and 300 W of power for biasing the substrate is supplied. In this way, the first conductive-layer pattern 108 can be formed.

After that, argon plasma treatment may be performed to remove or reduce a reaction product (TiOx) adhering to a taper sidewall portion of the first conductive-layer pattern, which is considered a stopper film. In the argon plasma treatment, the ICP etching system is used similarly, argon is supplied at 150 sccm, and each of 450 W of power for generating plasma and 100 W of power for biasing the substrate is supplied under a pressure of 2.0 Pa to perform the treatment for 30 sec.

Figure 4:
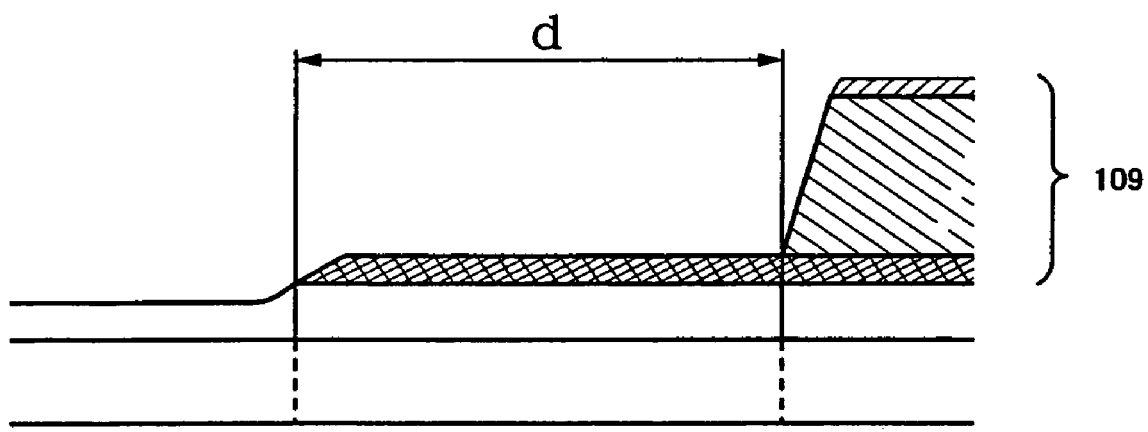
FIG. 4 is a diagram for explaining the relation between a recess width d of a second conductive layer and a length of Lov of a gate overlapping TFT.

Next, anisotropic etching is performed with the use of $BCl_3$, $Cl_2$, and $O_2$ as etching gas to process mainly the second conductive layer 105'. The etching pressure is set at 1.9 Pa, and each of 500W of power for generating plasma and 10 W of power for biasing the substrate is supplied. The edge of the second conductive layer 105' is recessed inward from the edge of the first conductive layer 104'. In this way, the second conductive-layer pattern 109 is formed, which becomes a gate electrode at a portion intersecting with the semiconductor layer 102. The recess width from the edge of the first conductive layer 104' can be made 1 μm or more. As shown in FIG. 4, the recess width d becomes a length that determines the length of Lov. Table 1 is a table comparing an etching rate of each of titanium and tantalum nitride and a selection ratio of titanium to tantalum nitride in the case of using gas base on $CF_4$, $Cl_2$, and $O_2$ to those in the case of using gas based on $BCl_3$, $Cl_2$, and $O_2$ in a similar process to the present embodiment.

[Table 1]

As clearly shown in Table 1, in the case of a laminate in which the first conductive layer containing tantalum nitride, the second conductive layer containing titanium, and the third conductive layer containing titanium nitride, the selection ratio of titanium to tantalum nitride is high when the gas based on $BCl_3$, $Cl_2$, and $O_2$ is used as etching gas in anisotropic etching for forming the second conductive-layer pattern.

Figure 5:
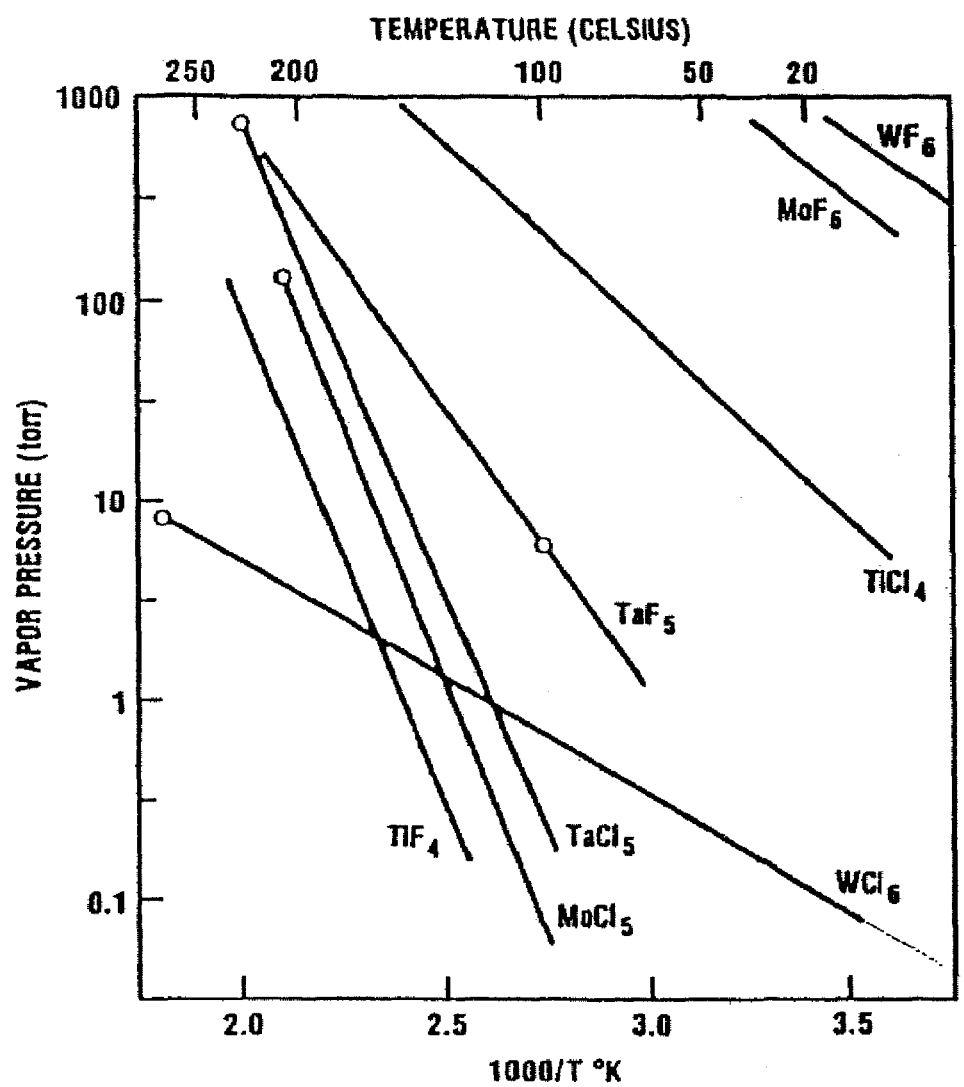
FIG. 5 is a diagram showing vapor pressures of titanium fluoride, titanium chloride, tantalum fluoride and tantalum chloride.

FIG. 5 shows a vapor pressure of each of titanium fluoride, tantalum fluoride, titanium chloride, and tantalum chloride. According to FIG. 5, it is understood that the relation of the vapor pressure is $TiF_4 < TaF_5$ and $TiCl_4 > TaCl_5$, and it can be presumed that titanium (TI) becomes easy to be etched and tantalum nitride (TaN) becomes hard to be etched when etching is performed using mainly chlorine-based gas rather than fluorine-based gas. In other words, when the chlorine-based gas is used in anisotropic etching, it is possible to obtain etching characteristics in which the etching ratio of titanium to tantalum nitride is high.

Since a surface of the edge of the second conductive layer 105' (titanium) is oxidized to become titanium oxide (TiOx), it is hard to etch the titanium oxide (TiOx) at the surface in the case of using fluorine-based gas and chlorine as etching gas in anisotropic etching, and thereby, the etching process becomes difficult. Therefore, in the etching conducted with the use of the gas based on $CF_4$, $Cl_2$, and $O_2$ in Table 1, the measurement result has an extremely low-etching rate of titanium, and extended etching time results in titanium etched at high speed after etching of the titanium oxide (TiOx) at the surface is completed. However, in the case of using $BCl_3$, an etching process becomes easier since the titanium oxide (TiOx) at the surface is easily etched.

Figure 6:
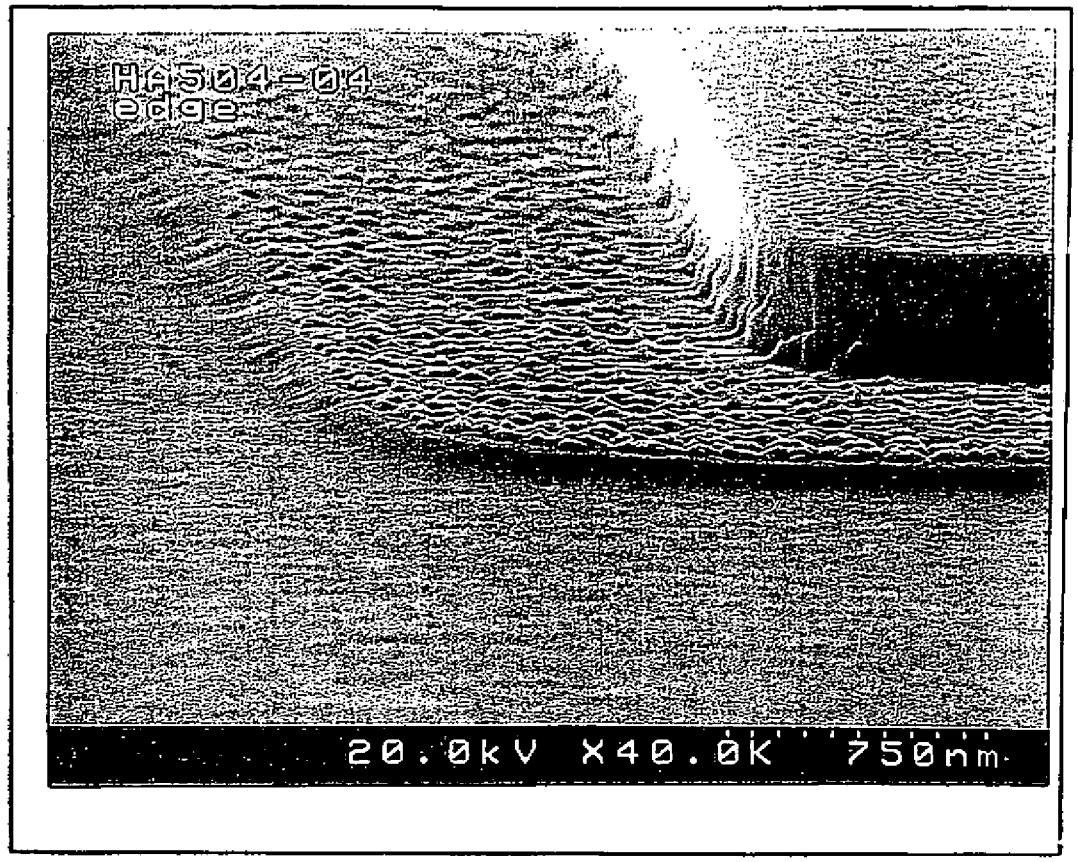
FIG. 6 is an SEM image showing a shape of a conductive-layer pattern subjected to an etching process.

FIG. 6 shows an image through SEM showing a typical processed shape in the case of etching with the use of gas of $BCl_3$, $Cl_2$, and $O_2$ for an isotropic etching process, which each shows a state in which a tantalum nitride layer and a titanium layer are laminated sequentially from the bottom. Although the diagram shows the SEM image observed from an angle, a recess width of the titanium layer or a projecting width of the titanium nitride layer is estimated to be about 1.1 µm to 1.5 µm. Therefore, it is confirmed that Lov can be controlled precisely according to the present invention.

Thereafter, the one conductivity type impurity region 110 with the first concentration for forming the LDD is doped with phosphorous or boron at a concentration from $1 \times 10^{16}$ to $5 \times 10^{18}/cm^3$ (peak value) under an acceleration voltage of 50 kV by ion doping. (FIG. 2A)

Besides, in the doping process for forming a source/drain region, the second conductive-layer pattern 109 is used as a mask for shielding ions and the one conductivity type impurity region 111 with the second concentration is formed outside the one conductivity type impurity region 110 with the first concentration, in this case, at the acceleration voltage of 10 kV and a concentration or phosphorous or boron at $1 \times 10^{19}$ to $5 \times 10^{21}/cm^3$ (peak value). (FIG. 2B)

After that, silicon oxynitride containing hydrogen is formed with plasma CVD to have a thickness of 100 nm, and photosensitive or non-photosensitive acrylic or polyimide resin is formed to have a thickness of 1 µm, thereby to form the fourth insulating film 113. Furthermore, the wiring 114 is formed according to need.

As described above, according to the present embodiment, it is possible to form an LDD overlapping with a gate electrode in self-aligning and to control the LDD (Lov) for a necessary length with the use of the gate electrode as a mask during ion doping. The length of an LDD region overlapping with a gate electrode can be controlled precisely to enable increasing a lifetime against degradation due to hot carriers and manufacturing a semiconductor device that has high reliability with high yield.

Embodiment 2

The present invention can apply to semiconductor devices in which various display screens are provided.

Figure 12:
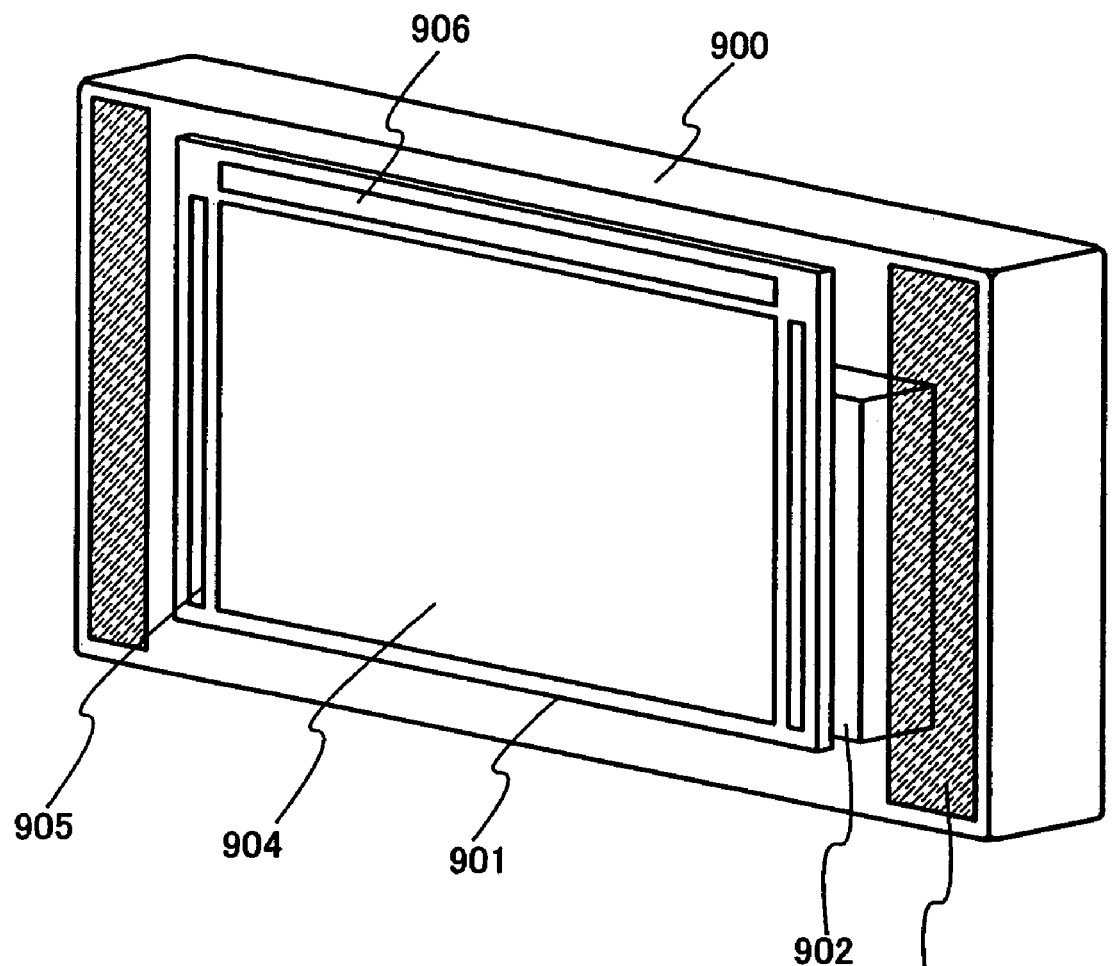
FIG. 12 is a diagram showing an example of a semiconductor device.

FIG. 12 is a structural example of a semiconductor device that has a display panel 901 mounted in a casing 900, which is applicable to television receivers and monitor systems of computers. In the casing 900, an electronic circuit board 902 and a speaker 903 for sound reproduction are loaded, wherein the electronic circuit board 902 incorporates an amplifier and a high-frequency circuit formed of a semiconductor integrated circuit, and a semiconductor memory or a magnetic memory such as a hard disk as a memory function to fulfill a function of displaying an image.

A display panel 901 can be comprising a driver-integrated type in which an active matrix pixel circuit 904 in which gate overlapping TFTs according to the present invention are used to arrange the TFT in a matrix shape, a scanning line driving circuit is 905, and a data line driving circuit 906 are formed integrally.

Figure 11:
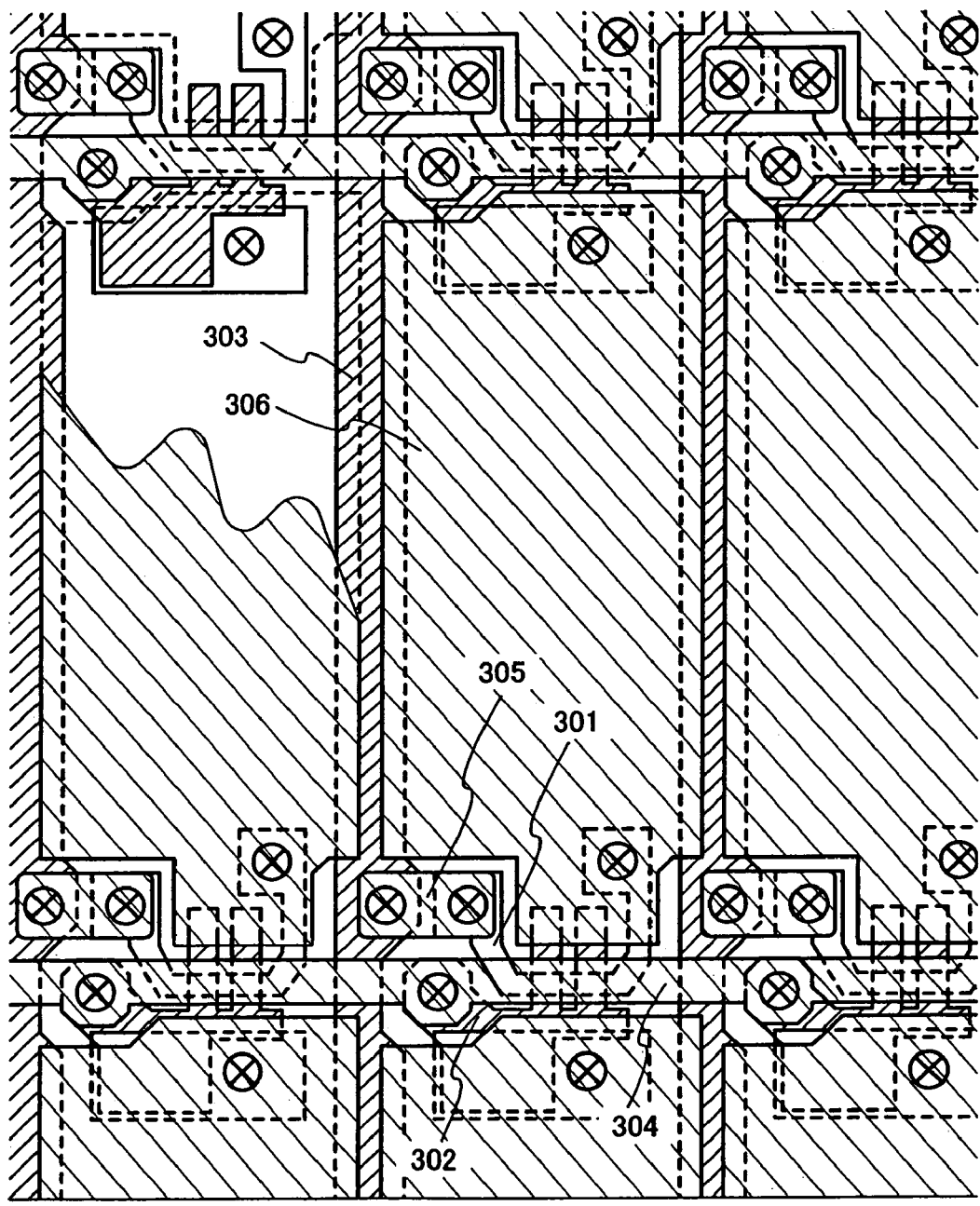
FIG. 11 is a top view showing active-matrix type pixels of a semiconductor device according to the present invention.

FIG. 11 is a diagram showing a principal structure of the active matrix pixel circuit 904. A gate electrode 302 intersecting with a semiconductor layer 301 and a data signal line 303 are formed of the same layer, that is, which is formed of a laminate including at least a conductive layer containing titanium as its main component, and an etching process for forming the gate electrode or the wiring pattern is performed according to Embodiment 1. In this manner, it is possible to form a gate overlapping TFT that has Lov with a length of 1 µm or more at low cost. A gate signal line 304 is formed in the above thereof with an interlayer insulating film interposed therebetween and has a structure in contact with the gate electrode 302 through a contact hole. Of course, this wiring can be formed of titanium and aluminum. It is also possible to form a wiring 305 that connects the data signal line 303 to the semiconductor layer 301 of the same layer as the gate signal line 304. A pixel electrode 306 is formed with the use of ITO (indium tin oxide) that is a compound of indium oxide and titanium oxide. The details of such pixels are disclosed in Japanese Patent Laid-Open 2001-313397.

In the present embodiment, an example has been shown in the semiconductor device. However, the invention is not limited to the present embodiment and can be applied to various semiconductor devices. It is possible to be applied to various fields, for example, in addition to navigation systems, sound reproducing systems (such as car audio systems and component audio systems), notebook-sized personal computers, game machines, personal digital assistants (such as mobile computers, cellular telephones, portable game machines, and electronic books), electrical home appliances such as refrigerators, washing machines, rice cookers, fixed telephones, vacuum cleaners, and clinical thermometers, railroad wall banners, and information displays such as arrival and departure guide plates in railroad stations and airports.

Although the embodiments according to the invention have been described as above, it is to be understood by those skilled in the art that various changes and modifications may be made without departing from the spirit and scope of the present invention.

The present invention makes it possible to enhance selectivity in an etching process in manufacturing a semiconductor device. The high selection ratio makes it possible to obtain a mask pattern in a desired shape, control precisely a range of an impurity region that has an effect of preventing degradation due to hot carriers, and manufacture a semiconductor device that has favorable uniform characteristics and high reliability with high yield.

Additionally, it becomes possible to dope a semiconductor layer with an impurity element to form an impurity region in self-aligning, and therefore, the number of masks can be reduced more than conventionally and trouble in forming a mask can also be eliminated. Accordingly, it is also possible to reduce the production cost of a semiconductor device and time necessary for the production.

TABLE 1

| | ICP | Bias | Press | SF$_6$ | CF$_4$ | BCl$_3$ | Cl$_2$ | O$_2$ | etch rate (Å/min) W | | TaN | | SiO$_2$ | | selection ratio W/TaN | |
|---|---|---|---|---|---|---|---|---|---|---|---|---|---|---|---|---|
| | W | W | Pa | sccm | sccm | sccm | sccm | sccm | AVE | p.n.u | AVE | p.n.u | AVE | p.n.u | AVE | p.n.u |
| condition 1 | 700 | 4 | 2.0 | 24 | | | 12 | 24 | 4822 | 8.2% | 1015 | 8.0% | 301 | 7.5% | 4.77 | 14.6% |

| | ICP | Bias | Press | SF$_6$ | CF$_4$ | BCl$_3$ | Cl$_2$ | O$_2$ | Ti | | TaN | | SiO$_2$ | | Ti/TaN | |
|---|---|---|---|---|---|---|---|---|---|---|---|---|---|---|---|---|
| | W | W | Pa | sccm | sccm | sccm | sccm | sccm | AVE | p.n.u | AVE | p.n.u | AVE | p.n.u | AVE | p.n.u |
| condition 2 | 500 | 10 | 1.9 | | 0 | | 80 | 0 | 129 | 49.8% | 835 | 50.8% | 41 | 27.4% | 0.16 | 64.5% |
| condition 3 | 790 | 10 | 1.9 | | 0 | | 80 | 0 | 490 | 79.3% | 1087 | 66.3% | 37 | 41.0% | 0.47 | 89.2% |
| condition 4 | 500 | 40 | 1.9 | | 0 | | 80 | 0 | (9600) | ※1 | 2755 | 9.0% | 225 | 7.7% | (3.89) | — |
| condition 5 | 500 | 10 | 1.9 | | 10 | | 70 | 0 | (12000) | ※2 | 775 | 26.0% | 224 | 9.5% | (20.58) | — |
| condition 6 | 500 | 10 | 1.9 | | 10 | | 65 | 5 | 545 | 69.9% | 257 | 52.6% | 230 | 9.7% | 2.08 | 49.2% |
| condition 7 | 500 | 10 | 1.9 | | | 65 | 10 | 8.5 | 6566 | 8.6% | 251 | 120.7% | 64 | 10.9% | 38.25 | 92.0% |
| condition 8 | 500 | 10 | 1.9 | | | 70 | 10 | 0 | 3534 | 16.6% | 220 | 67.5% | 123 | 10.0% | 25.03 | 145.1% |
| condition 9 | 500 | 10 | 1.9 | | | 35 | 40 | 8.5 | 4903 | 79.2% | 161 | 65.8% | 10 | 126.3% | 63.82 | 180.7% |
| condition 10 | 700 | 10 | 1.9 | | | 65 | 10 | 8.5 | 7315 | 11.8% | 211 | 47.6% | 90 | 11.7% | 37.57 | 50.8% |
| | | | | | | confirmation of reproducibility | | | | | | | | | | |
| condition 7 (again) | 500 | 10 | 1.9 | | | 65 | 10 | 8.5 | 5082 | 7.2% | 102 | 30.4% | 64 | 10.9% | 50.91 | 27.3% |
| condition 11 | 500 | 10 | 1.9 | | | 60 | 15 | 8.5 | 5929 | 6.3% | 125 | 25.5% | 56 | 15.9% | 48.71 | 30.5% |

※1 no step at the stage of etching for 15 seconds (=not etched) no deposited metal 8000 Å left at the stage of etching for 50 seconds
※2 no deposited metal 8000 Å left at the stage of etching for 40 seconds

What is claimed is:

1. A method for manufacturing a semiconductor device, comprising:
   forming a first layer over a substrate;
   forming a second layer containing titanium as its main component over the first layer;
   etching the first layer and the second layer to form a pattern;
   selectively etching the second layer in the pattern with plasma of boron trichloride, chlorine, and oxygen using ECR (Electron Cyclotron Resonance).

2. The method according to claim 1, wherein at least one of the first layer and the second layer is a conductive layer.

3. The method according to claim 1, wherein the first layer comprises tantalum nitride.

4. A method for manufacturing a semiconductor device, comprising:
   forming a first layer over a substrate;
   forming a second layer containing titanium as its main component over the first layer;
   etching the first layer and the second layer to form a pattern;
   selectively etching the second layer in the pattern with plasma of boron trichloride, chlorine, and oxygen using ICP (Inductively Coupled Plasma).

5. The method according to claim 4, wherein at least one of the first layer and the second layer is a conductive layer.

6. The method according to claim 4, wherein the first layer comprises tantalum nitride.

* * * * *